(12) United States Patent
Poon et al.

(10) Patent No.: US 7,751,026 B2
(45) Date of Patent: Jul. 6, 2010

(54) APPARATUS AND METHOD FOR RECOVERING FLUID FOR IMMERSION LITHOGRAPHY

(75) Inventors: Alex Ka Tim Poon, San Ramon, CA (US); Leonard Wai Fung Kho, San Francisco, CA (US); Gaurav Keswani, Milpitas, CA (US)

(73) Assignee: Nikon Corporation, Tokyo (JP)

( * ) Notice: Subject to any disclaimer, the term of this patent is extended or adjusted under 35 U.S.C. 154(b) by 392 days.

(21) Appl. No.: 11/443,361

(22) Filed: May 31, 2006

(65) Prior Publication Data

US 2007/0046910 A1  Mar. 1, 2007

Related U.S. Application Data (60) Provisional application No. 60/710,894, filed on Aug. 25, 2005.

(51) Int. Cl.
  *G03B 27/52* (2006.01)
(52) U.S. Cl. .......................... 355/30; 355/53
(58) Field of Classification Search ............. 355/30, 355/53; 700/282
  See application file for complete search history.

(56) References Cited

U.S. PATENT DOCUMENTS

| 5,668,672 A | 9/1997 | Oomura |
| 5,689,377 A | 11/1997 | Takahashi |
| 5,835,275 A | 11/1998 | Takahashi et al. |
| 7,053,983 B2 | 5/2006 | Tokita |
| 2004/0075895 A1 | 4/2004 | Lin |
| 2004/0160582 A1 | 8/2004 | Lof et al. |
| 2004/0165159 A1 | 8/2004 | Lof et al. |
| 2004/0263809 A1* | 12/2004 | Nakano ............... 355/30 |
| 2005/0280791 A1 | 12/2005 | Nagasaka et al. |
| 2006/0023182 A1 | 2/2006 | Novak et al. |
| 2006/0038968 A1 | 2/2006 | Kemper et al. |
| 2006/0087630 A1 | 4/2006 | Kemper et al. |
| 2006/0152697 A1 | 7/2006 | Poon et al. |

FOREIGN PATENT DOCUMENTS

| EP | 1 598 855 A1 | 11/2005 |
| JP | A-2005-191344 | 7/2005 |
| WO | WO 2004/086468 A1 | 10/2004 |
| WO | WO 2004/092833 A2 | 10/2004 |
| WO | WO 2005/024517 A2 | 3/2005 |

\* cited by examiner

*Primary Examiner*—Edward J Glick
*Assistant Examiner*—Mesfin T Asfaw
(74) *Attorney, Agent, or Firm*—Oliff & Berridge, PLC (57) ABSTRACT

A apparatus and methods recover a fluid from an immersion area formed in a gap between a projection system and an object of exposure in an immersion lithography system. A porous member is disposed adjacent to the immersion area. A pressure control system provides a first low pressure to a first portion of the porous member to remove immersion fluid that escapes from the immersion area, and provides a second low pressure to a second portion of the porous member to remove immersion fluid that escapes from the immersion area. The second low pressure is different from the first low pressure.

44 Claims, 7 Drawing Sheets

APPARATUS AND METHOD FOR RECOVERING FLUID FOR IMMERSION LITHOGRAPHY

CROSS-REFERENCE TO RELATED APPLICATION

This application claims the benefit of U.S. Provisional Patent Application No. 60/710,894 filed Aug. 25, 2005, the disclosure of which is incorporated herein by reference in its entirety.

BACKGROUND

The invention relates generally to immersion lithography apparatus and methods, and particularly to apparatus and methods for recovering the immersion fluid from an immersion area formed in a gap between a projection system and an object of exposure in an immersion lithography system.

Lithography exposure apparatus are commonly used to transfer images from a reticle onto a semiconductor wafer during semiconductor processing. A typical exposure apparatus includes an illumination source, a reticle stage assembly that positions a reticle containing one or more patterns, a projection system, a wafer stage assembly that positions a semiconductor wafer, and a measurement system that precisely monitors the positions of the reticle and the wafer. As is known, lithography exposure apparatus also can be used to form images on substrates other than semiconductor wafers, for example, glass or quartz substrates in order to form, for example, flat panel displays such as LCD displays.

Immersion lithography is a technique that can enhance the resolution of lithography exposure apparatus by permitting exposure to take place with a numerical aperture (NA) that is greater than the NA that can be achieved in conventional "dry" lithography exposure apparatus. By filling the space between the final optical element of the projection system and the resist-coated target (wafer or other substrate), immersion lithography permits exposure with light that would otherwise be internally reflected at an optic-air interface. Numerical apertures as high as the index of the immersion fluid (or of the resist or lens material, whichever is least) are possible in immersion lithography systems. Liquid immersion also increases the wafer depth-of-focus, that is, the tolerable error in the vertical position of the wafer, by the index of the immersion fluid compared to a dry system having the same numerical aperture. Immersion lithography thus has the potential to provide resolution enhancement equivalent to a shift from 248 nm to 193 nm without actually decreasing the exposure light wavelength. Thus, unlike a shift in the exposure light wavelength, the use of immersion would not require the development of new light sources, optical materials (for the illumination and projection systems) or coatings, and should allow the use of the same or similar resists as conventional "dry" lithography at the same wavelength. In an immersion system in which only the final optical element of the projection system and its housing and the wafer (and perhaps portions of the stage as well) are in contact with the immersion fluid, much of the technology and design developed for dry lithography can carry over directly to immersion lithography.

However, because the wafer (or other substrate) moves rapidly in a typical lithography system, the immersion fluid in the immersion area between the projection system and the substrate tends to be carried away from the immersion area. If the immersion fluid escapes from the immersion area, that fluid can interfere with operation of other components of the lithography system. One way to recover the immersion fluid and prevent the immersion fluid from contaminating the immersion lithography system is described in WO 2005/24517, which corresponds to U.S. patent application No. 11/362,833, the disclosure of which is incorporated herein by reference in its entirety. This document discloses an immersion fluid supply and recovery system in which a porous member surrounds the immersion area and is in fluid communication with the space that defines the immersion area. The porous member is maintained at a pressure that is under the bubble point of the porous member, whereby immersion fluid that escapes from the immersion area is captured (recovered) by the porous member. The porous member encircles the immersion area and is maintained at a substantially constant low pressure.

SUMMARY

According to aspects of the invention, an apparatus recovers a fluid from an immersion area formed in a gap between a projection system and an object of exposure in an immersion lithography system by providing a porous member adjacent to the immersion area. In addition, a pressure control system provides a first low pressure to a first portion of the porous member to remove immersion fluid that escapes from the immersion area, and provides a second low pressure to a second portion of the porous member to remove immersion fluid that escapes from the immersion area, with the second low pressure being different from the first low pressure. Providing different levels of low pressure to different portions of the porous member can help to control the size of the immersion area and/or accommodate movement of the object of exposure relative to the porous member (and the projection system).

For example, when the immersion lithography system is a scanning exposure system that moves the object in a scanning direction during exposure of the object, it is preferable that (i) the first portion of the porous member, which is maintained at the first low pressure, is disposed on first and second opposite sides of the immersion area that extend in a direction that intersects the scanning direction, and (ii) the second portion of the porous member, which is maintained at the second low pressure, is disposed on third and fourth opposite sides of the immersion area that extend in a direction that is parallel to the scanning direction. That is, the first and second opposite sides are respectively located in front of and behind the immersion area with respect to the scanning direction, while the third and fourth opposite sides are located on lateral sides (typically the shorter sides) of the immersion area relative to the scanning direction. Preferably, the first low pressure, supplied to the first and second opposite sides of the immersion area, is lower than the second low pressure supplied to the third and fourth opposite sides of the immersion area.

In preferred embodiments, the porous member encircles the immersion area.

The first and second portions can have identical shapes or they may have different shapes.

Preferably, the first and second low pressures each maintain a pressure at a surface of the porous member below a bubble point of the porous member so that gas bubbles are not entrained through the porous member, which could cause undesirable vibration of the fluid recovery apparatus.

The porous member can be a mesh, a porous material or a member having etched holes therein. The surface of the porous member that faces the object of exposure can be flat or the surface can taper such that the central portion of the porous member is disposed closer to the object of exposure than are the radially outer edges of the porous member.

According to preferred embodiments, the porous member is disposed on a radially outer portion of the fluid recovery apparatus, and a radially inner portion of the apparatus includes immersion fluid supply openings to supply the immersion fluid to the immersion area and immersion fluid removal openings that remove the immersion fluid from the immersion area.

According to some embodiments, a manifold is in fluid communication with the porous member, and is partitioned into a first cavity and a second cavity. The first cavity is maintained at the first low pressure and communicates with the first portion of the porous member, while the second cavity is maintained at the second low pressure and communicates with the second portion of the porous member.

Other aspects of the invention relate to an immersion lithography system for transferring an image onto an object. The immersion lithography system preferably includes a projection system, a stage for holding the object, with the projection system forming the image on the object held by the stage, an immersion fluid supply system that supplies an immersion fluid to an immersion area formed in a gap between the projection system and the object held by the stage, and the fluid recovery apparatus according to aspects of the invention.

Other aspects of the invention relate to processes for manufacturing a device utilizing an immersion lithography system having a fluid recovery apparatus according to aspects of the invention.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
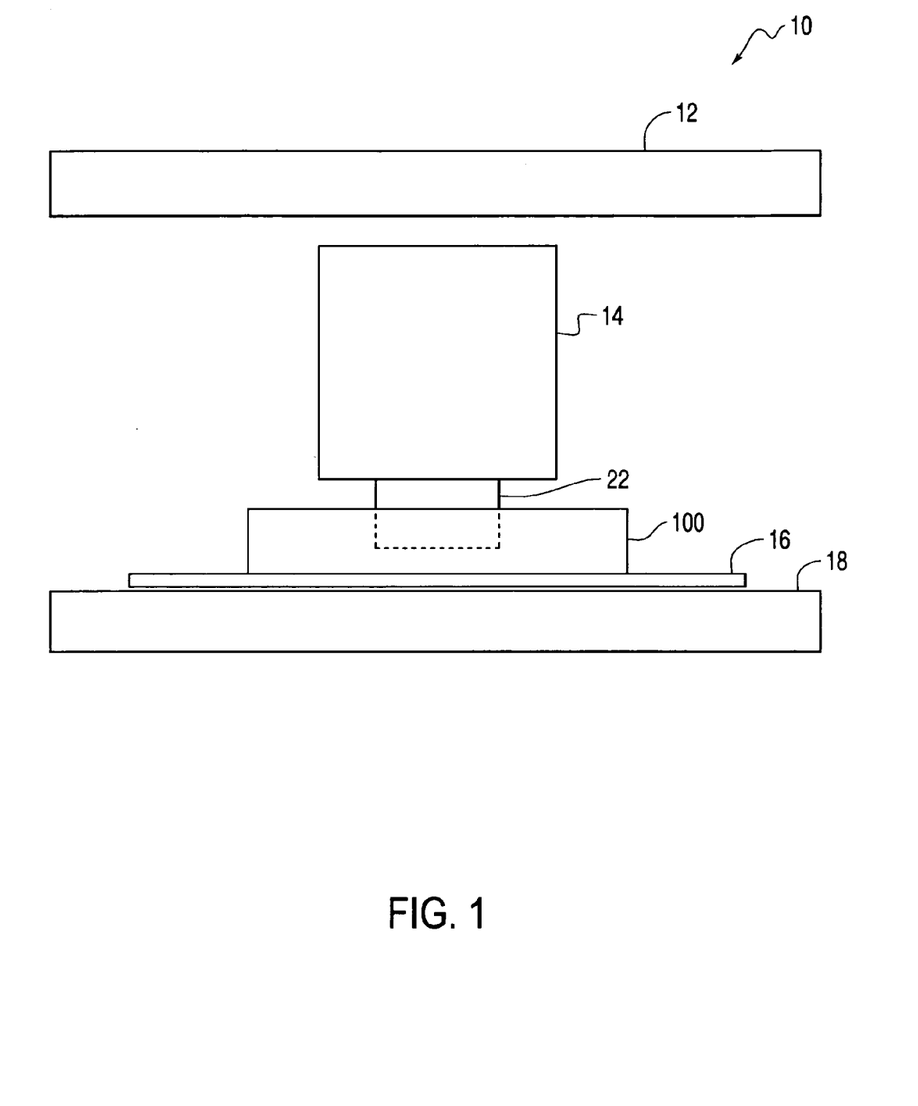
FIG. 1 is a simplified elevational view schematically illustrating an immersion lithography system according to an embodiment of the invention.

FIG. 1 shows an immersion lithography system 10 including a reticle stage 12 on which a reticle is supported, a projection system 14, and a wafer 16 supported on a wafer stage 18. An immersion fluid supply and recovery apparatus 100, which is sometimes referred to herein as an immersion fluid supply and recovery nozzle, is disposed around the final optical element 22 of the projection system 14 so as to provide and recover an immersion fluid, which may be a liquid such as, for example, water between the final optical element 22 and the wafer 16. In the present embodiment, the immersion lithography system 10 is a scanning lithography system in which the reticle 12 and the wafer 16 are moved synchronously in respective scanning directions during a scanning exposure operation.

The illumination source of the lithography system can be a light source such as, for example, a mercury g-line source (436 nm) or i-line source (365 nm), a KrF excimer laser (248 nm), an ArF excimer laser (193 nm) or a $F_2$ laser (157 nm). The projection system 14 projects and/or focuses the light passing through the reticle 12 onto the wafer 16. Depending upon the design of the exposure apparatus, the projection system 14 can magnify or reduce the image illuminated on the reticle 12. It also could be a 1× magnification system.

When far ultra-violet radiation such as from the excimer laser is used, glass materials such as quartz and fluorite that transmit far ultra-violet rays can be used in the projection system 14. The projection system 14 can be catadioptric, refractive or completely reflective.

With an exposure device that employs radiation of wavelength 200 nm or lower, use of the catadioptric type optical system can be considered. Examples of the catadioptric type of optical system are shown in U.S. Pat. No. 5,668,672 and U.S. Pat. No. 5,835,275. In these cases, the reflecting optical device can be a catadioptric optical system incorporating a beam splitter and concave mirror. U.S. Pat. No. 5,689,377 also uses a reflecting-refracting type of optical system incorporating a concave mirror, etc., but without a beam splitter, and can also be employed with this invention. The disclosures of the above-mentioned U.S. patents are incorporated herein by reference in their entireties.

Figure 2:
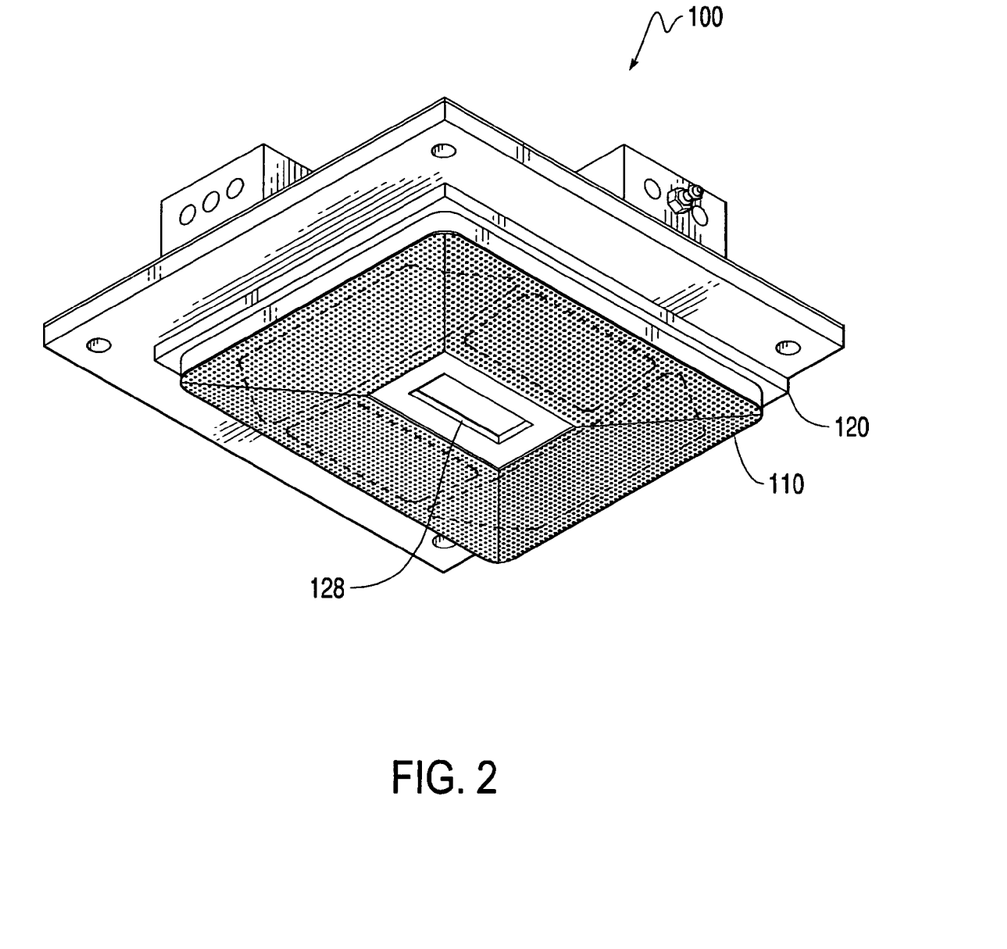
FIG. 2 is a perspective view of a nozzle for fluid delivery and recovery for immersion lithography according to one embodiment of the invention.
Figure 3:
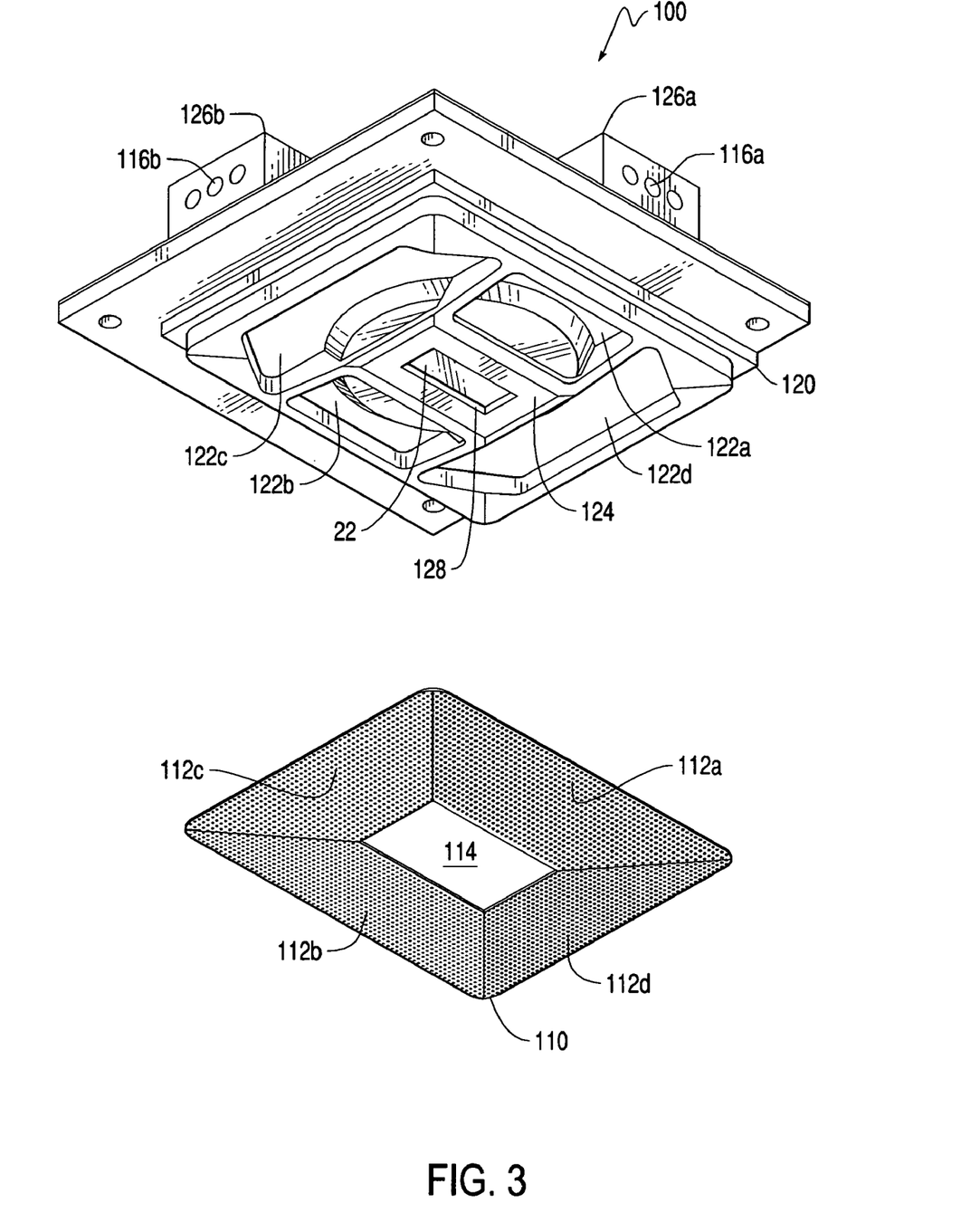
FIG. 3 is an exploded view of the FIG. 2 nozzle, showing the porous member separated from a manifold portion of the nozzle.

FIG. 2 is a perspective view of one embodiment of an immersion fluid supply and recovery nozzle 100 according to aspects of the invention, and FIG. 3 shows an exploded view of the nozzle 100 assembled around the final optical element 22 of the projection system 14. As is generally known from the above-incorporated WO 2005/24517 (and corresponding U.S. patent application No. 11/362,833), the nozzle 100 includes a housing or manifold portion 120 and a porous member 110. The housing 120 includes various passages through which immersion fluid is supplied to and conveyed away from the gap that is formed between the final optical element 22 of the projection system 14 and the substrate (e.g., wafer 16) that is the object of exposure. The nozzle 100 illustrated herein has a different overall architecture from the nozzle illustrated in the above-incorporated PCT and U.S. applications, and, as will be described in more detail below, includes structure such that different portions of the porous member 110 are provided with different low pressures in order to further improve the immersion fluid recovery capabilities of the nozzle. In the illustrated embodiments, two different low pressures are provided to different portions of the porous member. However, the invention also could be used to supply more than two different low pressures to more than two different portions of the porous member 110.

FIGS. 2 and 3 are views of the lower surface of the nozzle 100. As can be appreciated from FIGS. 1 and 3, the nozzle 100 encircles the final optical element 22 of the projection system 14. Because the illustrated embodiment is a scanning exposure apparatus in which the reticle and the substrate are synchronously moved relative to the projection system 14 during exposure, a generally slit-shaped irradiation area is projected through the reticle 12, projection system 14 and onto the substrate 16. Accordingly, the lower portion of the housing 120 includes a slit-shaped (or rectangular) opening 128 formed in a larger rectangular land portion 124. The irradiation beam passes through the opening 128 during exposure.

When fully assembled, the porous member 110 encircles the opening 128 and the land portion 124, as can be seen in FIG. 2. The immersion area is formed in the gap between the final optical element 22 of the projection system 14 and the upper surface of the substrate (e.g., wafer 16) that is the object of exposure. The immersion area is also formed in the gap between the lower surface of the nozzle 100 and the upper surface of the substrate. The immersion area generally is located in the area of the land portion 124 and opening 128. As described below, immersion fluid such as water is supplied through the housing 120 to the immersion area and is maintained in the immersion area during exposure. As the substrate moves below the projection system 14 and nozzle 100, the porous member 110 that surrounds the immersion area prevents immersion fluid from escaping from the area below the nozzle 100.

In particular, and referring to FIG. 3, the housing 120, which functions as a manifold, includes a first cavity defined by first cavity portions 122a and 122b and a second cavity defined by second cavity portions 122c and 122d. The first cavity portions 122a and 122b are communicated with a first low pressure, whereas the second cavity portions 122c and 122d are communicated with a second low pressure that preferably is different from the first low pressure.

As illustrated in FIG. 3, the porous member 110 includes a rectangular central opening 114 into which the land portion 124 of the housing 120 fits when the porous member 110 is assembled to the housing 120. The porous member 110 has a first portion defined on first side 112a and second opposite side 112b, and a second portion defined on third side 112c and opposite fourth side 112d. The first portion (on sides 112a and 112b) communicates with the first cavity (defined by first cavity portions 122a and 122b) and thus is maintained at the first low pressure. The second portion of the porous member 110 (defined by opposite sides 112c and 112d) communicates with the second cavity (defined by second cavity portions 122c and 122d) and thus is maintained at the second low pressure.

The upper portion of the nozzle housing 120 includes coupling portions 126a and 126b, which have one or more coupling members for attaching the flow passages of the nozzle 100 to immersion fluid supply lines and immersion fluid removal lines (not shown in FIG. 3). In the FIG. 3 example, the coupling portion 126a includes a coupling 116a that is attachable to a first low pressure source and communicates with the first cavity defined by first cavity portions 122a and 122b, whereas the second coupling portion 126b includes a coupling 116b that is attachable to a second low pressure source and communicates with the second cavity defined by second cavity portions 122c and 122d.

The surface of the porous member 110 that faces the wafer 16 (that is, the lower surface of the porous member 110) can be flat or tapered. In the illustrated embodiment, the porous member 110 tapers upwardly from its center toward its radial outer edges. Thus, when positioned adjacent to the wafer 16, the central portion of the porous member 110 (the portion adjacent to central opening 114) is located closer to the wafer 16 than the radially outer edges of the porous member 110.

The porous member 110 may be a mesh or may be formed of a porous material having holes typically with a size smaller than 150 microns. For example, the porous member 110 may be a wire mesh including woven pieces or layers of material made of metal, plastic, or the like, a porous metal, a porous glass, a porous plastic, a porous ceramic, or a sheet of material having chemically etched holes (for example, by photo-etching).

Figure 4:
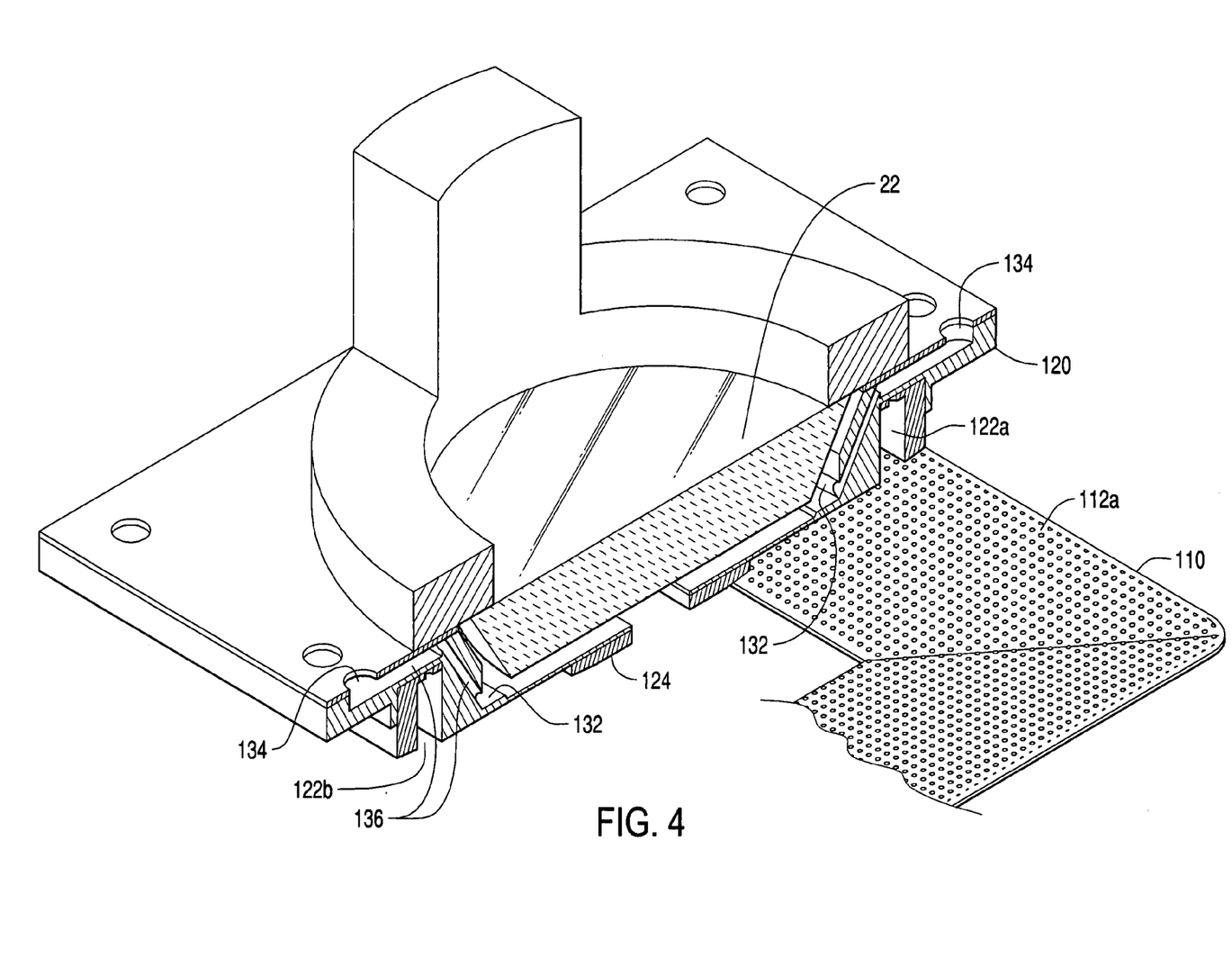
FIG. 4 is a perspective, partially cutaway view of the immersion nozzle and lower portion of projection system.

FIG. 4 is a perspective, partially cutaway view of the nozzle 100 assembled to the projection system 14, and shows the relative location of portions of the nozzle 100 relative to the final optical element 22 of the projection system 14. As can be seen in FIG. 4, the housing 120 includes openings 132 through which immersion fluid can be supplied to the immersion area. Immersion fluid is supplied to the housing 120 of the nozzle 100 via openings 134 on the surface of the housing. Additional coupling structure (not shown) is provided on the housing 120 for attaching immersion fluid supply lines to the openings 134. The housing 120 includes internal passages 136 that communicate the openings 134 with the openings 132. Accordingly, the immersion fluid is supplied to the immersion area, as is known.

FIG. 4 also shows the first cavity portions 122a and 122b forming the first cavity of the housing 120. Although not shown in FIG. 4, the first cavity portions 122a and 122b are in fluid communication with the coupling 116a for providing the first low pressure to the first cavity portions 122a and 122b.

Figure 5:
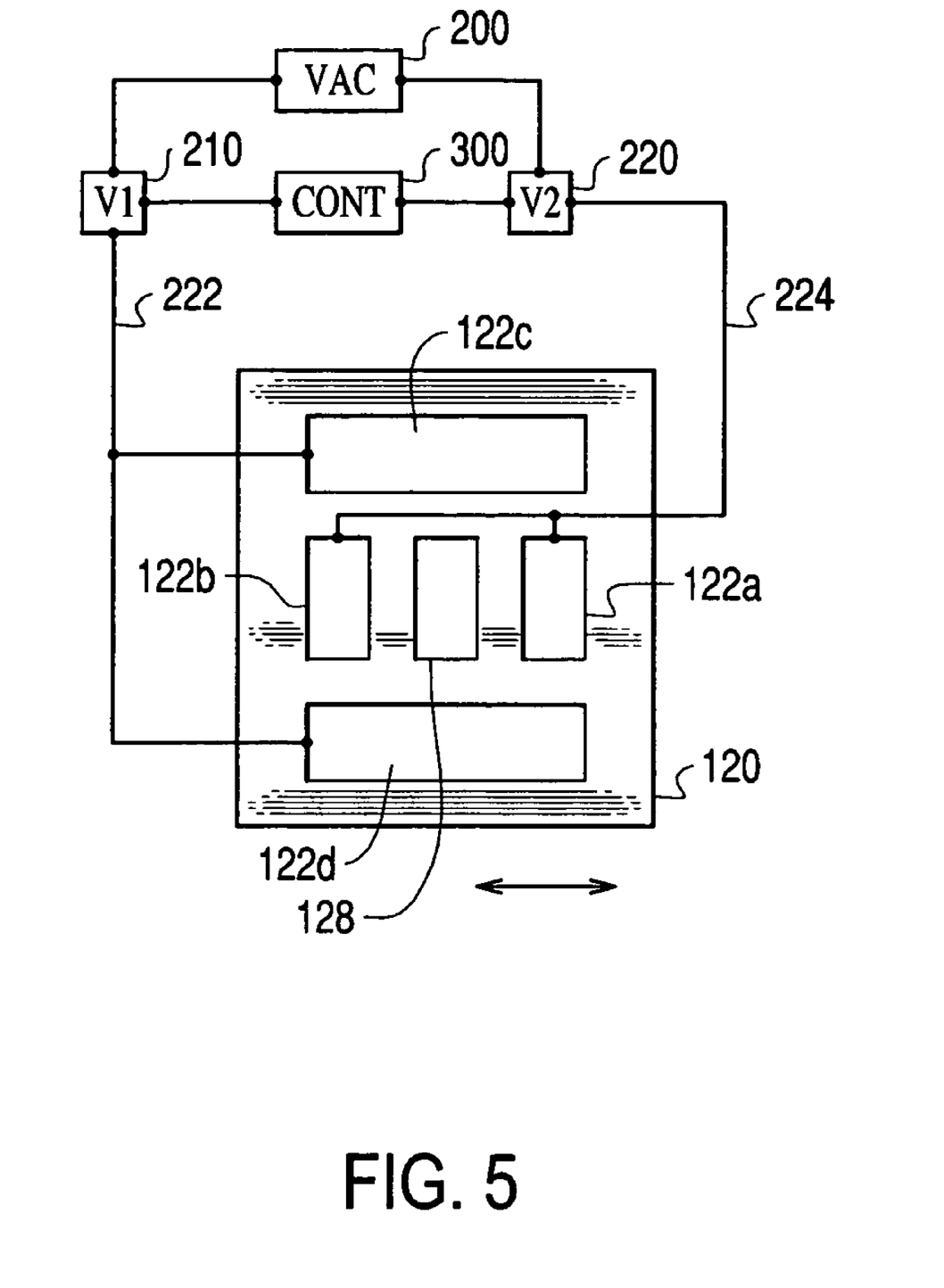
FIG. 5 is a diagram showing one embodiment for controlling the first and second low pressures supplied to the first and second manifold cavities of the immersion fluid supply and recovery nozzle.

FIG. 5 is a diagram showing one embodiment for controlling the first and second low pressures supplied to the first and second cavities of the immersion fluid supply and recovery nozzle 100. Unlike the embodiment shown in FIGS. 2-4, the first cavity portions 122a and 122b of the FIG. 5 embodiment have a shape that is the same as the shape of the second cavity portions 122c and 122d. The shapes of the cavity portions can be selected so as to maximize the fluid recovery capabilities of the nozzle 100. As shown in FIG. 5, the first cavity portions 122a and 122b communicate with a first low pressure line 224, whereas the second cavity portions 122c and 122d communicate with a second low pressure line 222. The first and second low pressure lines 224 and 222 communicate with a vacuum source 200 through respective control valves 220 and 210. A controller 300, such as, for example, a CPU with ROM and RAM, controls the control valves 220 and 210 so as to set the first low pressure line 224 at a first low pressure (by controlling valve 220) and to set the second low pressure line 222 at a second low pressure (by controlling valve 210). As noted previously, during scanning exposure in which the substrate 16 moves in the direction of the arrow in FIG. 5, it is preferable to set the first low pressure supplied to the first cavity portions 122a and 122b to a value that is lower than the second low pressure supplied to the second cavity portions 122c and 122d. It is, however, preferable to maintain both the first and second low pressures at a level that is below a bubble point of the porous member 110 so as to avoid vibrations and the generation of bubbles. The bubble point depends upon the structure of the porous member 110, including the size of its pores, the material and coating of the porous member and the properties of the immersion fluid. For example, a stainless steel mesh without coating having 80 microns diameter holes would have a bubble point of about 2 kPa with pure water as the immersion fluid.

Because the substrate also moves in the direction perpendicular to the scanning direction (that is, in a direction parallel to the longitudinal axis of opening 128), there also may be times when it is desirable to set the second low pressure supplied to the second cavity portions 122c and 122d to a value that is lower than the first low pressure supplied to the first cavity portions 122a and 122b. In general, providing different levels of low pressure to different portions of the porous member can help to control the size of the immersion area and/or accommodate movement of the object of exposure relative to the porous member (and the projection system).

There are numerous ways in which the low pressure provided to low pressure lines 224 and 222 can be controlled. Each line can be communicated with its own separate vacuum source instead of having a single vacuum source, as is shown in FIG. 5. For example, any of the pressure control methods described in the above-incorporated WO 2005/24517 and U.S. patent application No. 11/362,833 can be used to control the pressure supplied to each of the first and second cavities.

The invention is not limited to providing only two different low pressures to two different portions of the porous member. For example, four different low pressures could be respectively provided to each of the cavity portions 122a-122d and thus to porous member portions 112a-112d. The low pressure provided to each of the portions could be changed based on the movement direction and speed of the substrate. For example, a first low pressure could be supplied to the portion of the porous member located in front of the immersion area (relative to the scanning direction), a second low pressure could be supplied to the portion of the porous member located behind the immersion area (relative to the scanning direction) and a third low pressure could be supplied to the portions of the porous member located on the sides of the immersion area (relative to the scanning direction). The invention is not limited to providing only one porous member. A plurality of porous members may be assembled to the housing 120. For example, four different porous members could be respectively provided to each of the cavity portions 122a -122d.

There are a number of different types of lithographic apparatus, and although the illustrated embodiment is a scanning exposure apparatus, the invention also can be used with step-and-repeat type photolithography apparatus that expose the pattern from the reticle onto the substrate while the reticle and the substrate are stationary. In the step and repeat process, the substrate is in a constant position relative to the reticle and the projection system during the exposure of an individual field (shot area). Subsequently, between consecutive exposure steps, the substrate is consecutively moved with a substrate stage assembly perpendicularly to the optical axis of the projection system so that the next shot area of the substrate is brought into position relative to the projection system and the reticle for exposure. Following this process, the images on the reticle are sequentially exposed onto the shot areas of the substrate, and then the next shot area of the substrate is brought into position relative to the projection system and the reticle.

The use of the exposure apparatus described herein is not limited to a photolithography system for semiconductor manufacturing. The exposure apparatus, for example, can be used as an LCD photolithography system that exposes a liquid crystal display device pattern onto a rectangular glass plate or a photolithography system for manufacturing a thin film magnetic head.

Figure 6A:
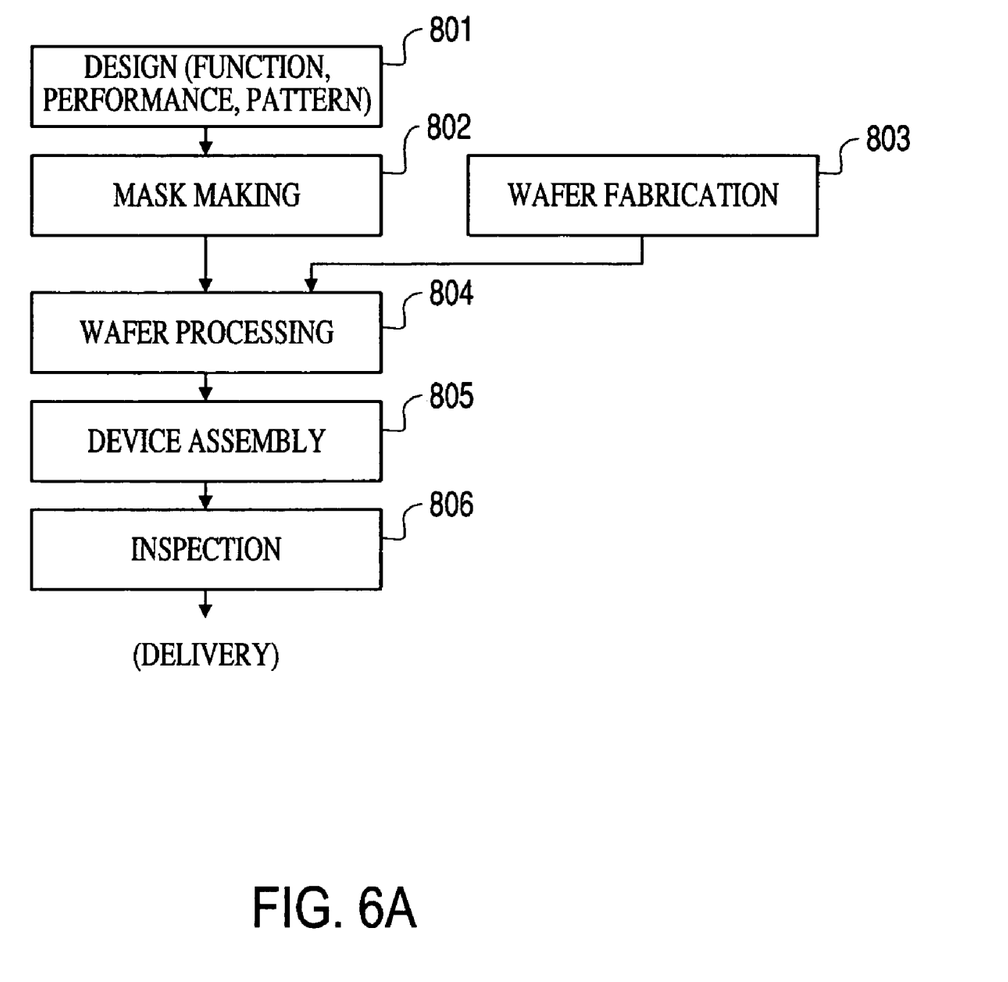
FIG. 6A is a flowchart that outlines a process for manufacturing a device in accordance with the invention.

Semiconductor devices can be fabricated using the above described systems, by the process shown generally in FIG. 6A. In step 801 the device's function and performance characteristics are designed. Next, in step 802, a mask (reticle) having a pattern is designed according to the previous designing step, and in a step 803 a wafer is made from a silicon material. The mask pattern designed in step 802 is exposed onto the wafer from step 803 in step 804 by a photolithography system described hereinabove in accordance with the invention. In step 805 the semiconductor device is assembled (including the dicing process, bonding process and packaging process). Finally, the device is then inspected in step 806.

Figure 6B:
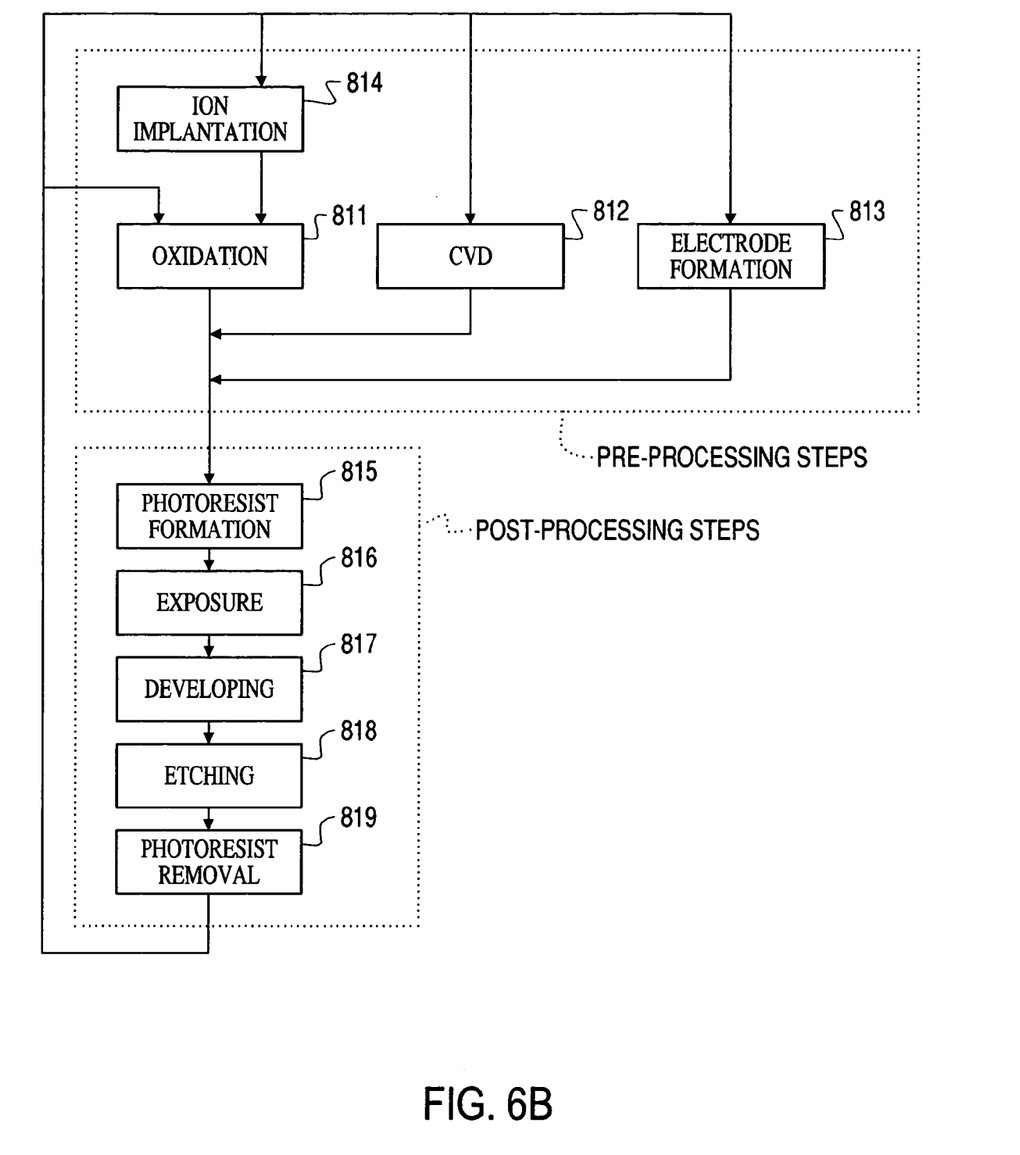
FIG. 6B is a flowchart that outlines device processing in more detail.

FIG. 6B illustrates a detailed flowchart example of the above-mentioned step 804 in the case of fabricating semiconductor devices. In FIG. 6B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An apparatus for recovering an immersion liquid from an immersion area formed in a gap between a projection system and an object of exposure in an immersion lithography system, the apparatus comprising:

a porous member disposed adjacent to the immersion area; and a pressure control system that provides a first low pressure to a first portion of the porous member to remove immersion liquid from the immersion area through the first portion of the porous member, and provides a second low pressure to a second portion of the porous member to remove immersion liquid from the immersion area through the second portion of the porous member, the second low pressure being different from the first low pressure.

2. The apparatus of claim 1, wherein the first portion of the porous member is disposed on first and second opposite sides of the immersion area, and the second portion of the porous member is disposed on third and fourth opposite sides of the immersion area.

3. The apparatus of claim 2, wherein the porous member encircles the immersion area.

4. The apparatus of claim 1, wherein the porous member encircles the immersion area.

5. The apparatus of claim 1, wherein a shape of the first portion of the porous member is the same as a shape of the second portion of the porous member.

6. The apparatus of claim 1, wherein a shape of the first portion of the porous member is different from a shape of the second portion of the porous member.

7. The apparatus of claim 1, wherein the first and second low pressures each maintain a pressure at a surface of the porous member below a bubble point of the porous member so that gas does not flow through the first and second portions of the porous member.

8. The apparatus of claim 1, wherein:
the immersion lithography system is a scanning exposure system that moves the object in a scanning direction during exposure of the object;
the first portion of the porous member is disposed on first and second opposite sides of the immersion area, the first and second opposite sides each extending in a direction that intersects the scanning direction;
the second portion of the porous member is disposed on third and fourth opposite sides of the immersion area, the third and fourth opposite sides each extending in a direction that is parallel to the scanning direction; and
the first low pressure supplied to the first portion of the porous member is lower than the second low pressure supplied to the second portion of the porous member.

9. The apparatus of claim 8, wherein the first and second low pressures each maintain a pressure at a surface of the porous member below a bubble point of the porous member so that gas does not flow through the first and second portions of the porous member.

10. The apparatus of claim 1, wherein the porous member is one of a mesh, a porous material and a member having etched holes therein.

11. The apparatus of claim 1, wherein the porous member is disposed on a radially outer portion of the apparatus, and a radially inner portion of the apparatus includes immersion liquid supply openings that supply the immersion liquid to the immersion area.

12. An immersion lithography system for transferring an image onto an object, the immersion lithography system comprising:
a projection system;
a stage which holds the object, the projection system forms the image on the object held by the stage;
an immersion liquid supply system that supplies an immersion liquid to an immersion area that is formed in a gap between the projection system and the object held by the stage; and
the apparatus of claim 1 for recovering the immersion liquid from the immersion area.

13. A process for manufacturing a device comprising the steps of providing an object and transferring an image onto the object utilizing the immersion lithography system of claim 12.

14. An apparatus for recovering a liquid from an immersion area formed in a gap between a projection system and an object of exposure in an immersion lithography system, the apparatus comprising:
a porous member disposed adjacent to the immersion area;
a manifold in liquid communication with the porous member, the manifold partitioned into at a first cavity and a second cavity;
the first cavity maintained at a first low pressure to remove immersion liquid from the immersion area through a first portion of the porous member which communicates with the first cavity; and
the second cavity maintained at a second low pressure to remove immersion liquid from the immersion area through a second portion of the porous member which communicates with the second cavity, the second low pressure being different from the first low pressure.

15. The apparatus of claim 14, wherein the first cavity is disposed on first and second opposite sides of the immersion area, and the second cavity is disposed on third and fourth opposite sides of the immersion area.

16. The apparatus of claim 14, wherein the porous member encircles the immersion area.

17. The apparatus of claim 16, wherein the first cavity is disposed on first and second opposite sides of the immersion area, and the second cavity is disposed on third and fourth opposite sides of the immersion area.

18. The apparatus of claim 14, wherein a shape of the first cavity is the same as a shape of the second cavity.

19. The apparatus of claim 14, wherein a shape of the first cavity is different from a shape of the second cavity.

20. The apparatus of claim 14, wherein the first and second low pressures each maintain a pressure at a surface of the porous member below a bubble point of the porous member so that gas does not flow through the first and second portions of the porous member.

21. The apparatus of claim 14, wherein:
the immersion lithography system is a scanning exposure system that moves the object in a scanning direction during exposure of the object;
the first cavity is disposed on first and second opposite sides of the immersion area, the first and second opposite sides each extending in a direction that intersects the scanning direction;
the second cavity is disposed on third and fourth opposite sides of the immersion area, the third and fourth opposite sides each extending in a direction that is parallel to the scanning direction; and
the first low pressure supplied to the first cavity is lower than the second low pressure supplied to the second cavity.

22. The apparatus of claim 21, wherein the first and second low pressures each maintain a pressure at a surface of the porous member below a bubble point of the porous member so that gas does not flow through the first and second portions of the porous member.

23. The apparatus of claim 14, wherein the porous member is one of a mesh, a porous material and a member having etched holes therein.

24. The apparatus of claim 14, wherein the porous member is disposed on a radially outer portion of the apparatus, and a radially inner portion of the apparatus includes immersion liquid supply openings that supply the immersion liquid to the immersion area.

25. An immersion lithography system for transferring an image onto an object, the immersion lithography system comprising:

a projection system;

a stage which holds the object, the projection system forms the image on the object held by the stage;

an immersion liquid supply system that supplies an immersion liquid to an immersion area that is formed in a gap between the projection system and the object held by the stage; and the apparatus of claim 14 for recovering the immersion liquid from the immersion area.

26. A process for manufacturing a device comprising the steps of providing an object and transferring an image onto the object utilizing the immersion lithography system of claim 25.

27. A method of recovering a liquid from an immersion area formed in a gap between a projection system and an object of exposure in an immersion lithography system, the method comprising:

drawing immersion liquid from the immersion area via a porous member that is disposed adjacent to the immersion area; and controlling a pressure that is supplied to the porous member by providing a first low pressure to a first portion of the porous member to remove immersion liquid from the immersion area through the first portion of the porous member, and by providing a second low pressure to a second portion of the porous member to remove immersion liquid from the immersion area through the second portion of the porous member, the second low pressure being different from the first low pressure.

28. The method of claim 27, wherein the first portion of the porous member is disposed on first and second opposite sides of the immersion area, and the second portion of the porous member is disposed on third and fourth opposite sides of the immersion area.

29. The method of claim 28, wherein the porous member encircles the immersion area.

30. The method of claim 27, wherein the porous member encircles the immersion area.

31. The method of claim 27, wherein a shape of the first portion of the porous member is the same as a shape of the second portion of the porous member.

32. The method of claim 27, wherein a shape of the first portion of the porous member is different from a shape of the second portion of the porous member.

33. The method of claim 27, wherein the first and second low pressures each maintain a pressure at a surface of the porous member below a bubble point of the porous member so that gas does not flow through the first and second portions of the porous member.

34. The method of claim 27, wherein:

the immersion lithography system is a scanning exposure system that moves the object in a scanning direction during exposure of the object;

the first portion of the porous member is disposed on first and second opposite sides of the immersion area, the first and second opposite sides each extending in a direction that intersects the scanning direction;

the second portion of the porous member is disposed on third and fourth opposite sides of the immersion area, the third and fourth opposite sides each extending in a direction that is parallel to the scanning direction; and the first low pressure supplied to the first portion of the porous member is lower than the second low pressure supplied to the second portion of the porous member.

35. The method of claim 34, wherein the first and second low pressures each maintain a pressure at a surface of the porous member below a bubble point of the porous member so that gas does not flow through the first and second portions of the porous member.

36. The method of claim 27, wherein the porous member is one of a mesh, a porous material and a member having etched holes therein.

37. The method of claim 27, wherein the porous member is disposed on a radially outer portion of the apparatus, and a radially inner portion of the apparatus includes immersion liquid supply openings, and further comprising supplying the immersion liquid to the immersion area through the immersion liquid supply openings.

38. The method of claim 27, wherein the immersion liquid is drawn through the porous member by communicating the first portion of the porous member with a first cavity that is maintained at the first low pressure, and by communicating the second portion of the porous member with a second cavity that is maintained at the second low pressure.

39. The apparatus of claim 1, wherein the first and second portions of the porous member have a same porosity.

40. The apparatus of claim 1, wherein the first and second portions of the porous member have an identical structure.

41. The apparatus of claim 14, wherein the first and second portions of the porous member have a same porosity.

42. The apparatus of claim 14, wherein the first and second portions of the porous member have an identical structure.

43. The method of claim 27, wherein the first and second portions of the porous member have a same porosity.

44. The method of claim 27, wherein the first and second portions of the porous member have an identical structure.

* * * * *